(12) United States Patent
Lee et al.

(10) Patent No.: US 10,078,165 B2
(45) Date of Patent: Sep. 18, 2018

(54) POLARIZING UNIT AND ORGANIC LIGHT EMITTING DIODE DISPLAY INCLUDING THE SAME

(71) Applicant: SAMSUNG DISPLAY CO., LTD., Yongin-si, Gyeonggi-do (KR)

(72) Inventors: Hee Young Lee, Suwon-si (KR); Suk Choi, Hwaseong-si (KR); Tae Young Ahn, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/417,586

(22) Filed: Jan. 27, 2017

(65) Prior Publication Data

US 2017/0219756 A1  Aug. 3, 2017

(30) Foreign Application Priority Data

Jan. 28, 2016 (KR) .................. 10-2016-0010897

(51) Int. Cl.
*G02B 5/30* (2006.01)
*H01L 51/52* (2006.01)
*G02B 1/11* (2015.01)

(52) U.S. Cl.
CPC .............. *G02B 5/3083* (2013.01); *G02B 1/11* (2013.01); *G02B 5/3041* (2013.01); *H01L 51/5281* (2013.01); *H01L 2251/5338* (2013.01); *H01L 2251/55* (2013.01); *H01L 2251/558* (2013.01)

(58) Field of Classification Search
CPC ...... G02B 5/3083; G02B 1/11; G02B 5/3041; H01L 51/5281

USPC ........... 359/489.02, 489.07, 489.15; 349/96, 349/117, 119, 120; 313/112
See application file for complete search history.

(56) References Cited

U.S. PATENT DOCUMENTS

| | | | | |
|---|---|---|---|---|
| 7,289,189 | B2* | 10/2007 | Saeed ................. | G02F 1/13473 349/117 |
| 9,690,025 | B2* | 6/2017 | Qin ..................... | G02B 5/3083 |
| 2003/0193635 | A1* | 10/2003 | Mi ....................... | G02B 27/286 349/117 |
| 2007/0121043 | A1* | 5/2007 | Moon ................... | G02F 1/1393 349/117 |
| 2008/0204635 | A1* | 8/2008 | Van Popta ............ | B82Y 20/00 349/96 |
| 2014/0293420 | A1* | 10/2014 | Ko ....................... | G02B 5/3083 359/489.07 |
| 2015/0002010 | A1* | 1/2015 | Lee ...................... | G02B 5/3083 313/112 |

(Continued)

FOREIGN PATENT DOCUMENTS

| KR | 10-1243828 | 3/2013 |
|---|---|---|
| KR | 10-1407304 | 6/2014 |

(Continued)

*Primary Examiner* — Frank Font
(74) *Attorney, Agent, or Firm* — F. Chau & Associates, LLC

(57) ABSTRACT

A polarization unit includes a plurality of retardation layers that each have a different retardation value, a polarization layer positioned above the plurality of retardation layers, a first compensation layer positioned between the polarization layer and the plurality of retardation layers, and a second compensation layer positioned below the plurality of retardation layers.

20 Claims, 19 Drawing Sheets

(56) References Cited

U.S. PATENT DOCUMENTS

| | | | |
|---|---|---|---|
| 2015/0131032 A1* | 5/2015 | Kim | G02B 5/3016 349/75 |
| 2015/0219814 A1* | 8/2015 | Qin | G02B 1/14 359/489.02 |
| 2016/0025913 A1* | 1/2016 | Oh | G02B 5/3025 359/487.02 |
| 2016/0154159 A1* | 6/2016 | Kim | G02B 5/3083 359/489.07 |
| 2016/0209563 A1* | 7/2016 | Kong | G02B 5/305 |

FOREIGN PATENT DOCUMENTS

| | | |
|---|---|---|
| KR | 10-2014-0085131 | 7/2014 |
| KR | 10-1525998 | 5/2015 |

\* cited by examiner

POLARIZING UNIT AND ORGANIC LIGHT EMITTING DIODE DISPLAY INCLUDING THE SAME

CROSS-REFERENCE TO RELATED APPLICATION

This application claims priority under 35 U.S.C. § 119 from, and the benefit of, Korean Patent Application No. 10-2016-0010897, filed in the Korean Intellectual Property Office on Jan. 28, 2016, the contents of which are herein incorporated by reference in their entirety.

BACKGROUND (a) Technical Field

An exemplary embodiment is directed to a polarization unit and an organic light emitting diode display including the same.

(b) Discussion of the Related Art

When external light is reflected or scattered from a display surface of a display device, the original image displayed on the display device is obscured. In particular, as portable devices such as mobile phones, portable multimedia players (PMPs), personal digital assistants (PDAs), laptop computers, etc., are being used outdoors where there is abundant external light, issues of reflection and scattering of external light from the display surface of the display device should be improved upon.

Recently, foldable display devices that may be folded or unfolded have been developed. A foldable display device is easy to carry and can realize a large-sized screen. A foldable display device can be incorporated into various stationary devices, such as TVs and monitors, as well as mobile devices such as mobile phones, PMPs, navigation, devices, ultra-mobile PCs (UMPCs), electronic books, electronic newspapers, etc.

Therefore, a foldable display device needs an antireflective film attached thereto, and a very thin antireflective film is needed for a foldable display device to fold with a small curvature radius.

SUMMARY

Exemplary embodiments can provide a polarization unit and an organic light emitting diode display that has optical properties that minimize color shift.

In addition, exemplary embodiments can provide a polarization unit and an organic light emitting diode display that improves flexibility by having a slim profile.

An exemplary embodiment of the present invention provides a polarization unit that includes a plurality of retardation layers that each have a different retardation value, a polarization layer positioned above the plurality of retardation layers, a first compensation layer positioned between the polarization layer and the plurality of retardation layers, and a second compensation layer positioned below the plurality of retardation layers.

Thickness direction retardation of the first compensation layer may be the same as that of the second compensation layer.

The plurality of retardation layers may include a first retardation layer and a second retardation layer positioned below the first retardation layer, the thickness direction retardation of the second compensation layer may be the same as that of the second retardation layer, and signs thereof may be opposite to each other.

The thickness direction retardation of the first compensation layer may be greater than or equal to one-half of that of the second retardation layer, and may be less than or equal to three times of that of the second retardation layer, and signs thereof may be opposite to each other.

The first retardation layer may have a $\lambda/2$ retardation value, and the second retardation layer may have a $\lambda/4$ retardation value.

The first retardation layer may have an in-plane retardation value for 550 nm wavelength incident light in a range of about 220 nm to about 270 nm, a short-wavelength dispersion value in a range of about 1.04 to about 1.11, and a long-wavelength dispersion value in a range of about 0.90 to about 1.02.

The second retardation layer has an in-plane retardation value for 550 nm wavelength. incident light in a range of about 110 nm to about 150 nm, a short-wavelength dispersion value in a range of about 1.04 to about 1.11, and a long-wavelength dispersion value in a range of about 0.90 to about 1.02.

A thickness of each of the first retardation layer and the second retardation layer may be in a range of about 0.2 μm to about 3 μm. A thickness of the polarization layer may be in a range of about 1 μm to about 40 μm.

Another embodiment of the present invention provides an organic light emitting diode display that includes a display panel and a polarization unit positioned on the display panel. The polarization unit includes: a plurality of retardation layers that each have a different retardation value; a polarization layer positioned above the plurality of retardation layers; a first compensation layer positioned between the polarization layer and the plurality of retardation layers; and a second compensation layer positioned below the plurality of retardation layers.

A thickness direction retardation of the first compensation layer may be the same as that of the second compensation layer.

The plurality of retardation layers may include a first retardation layer and a second retardation layer positioned below the first retardation layer, the thickness direction retardation of the second compensation layer may be the same as that of the second retardation layer, and signs thereof may be opposite to each other.

The thickness direction retardation of the first compensation layer may be greater than or equal to one-half of that of the second retardation layer, and may be less than or equal to three times of that of the second retardation layer, and signs thereof may be opposite to each other.

The first retardation layer may have a $\lambda/2$ retardation value, and the second retardation layer may have a $\lambda/4$ retardation value.

The first retardation layer has an in-plane retardation value for 550 nm wavelength incident light in a range of about 220 nm to about 270 nm, a short-wavelength dispersion value in a range of about 1.04 to about 1.11, and a long-wavelength dispersion value in a range of about 0.90 to about 1.02.

The second retardation layer has an in-plane retardation value for 550 nm wavelength incident light in a range of about 110 nm to about 150 nm, a short-wavelength dispersion value in a range of about 1.04 to about 1.11, and a long-wavelength dispersion value in a range of about 0.90 to about 1.02.

A thickness of each of the first retardation layer and the second retardation layer may be in a range of about 0.2 μm to about 3 μm. A thickness of the polarization layer may be in a range of about 1 μm to about 40 μm.

An exemplary embodiment of the present invention provides a polarization unit that includes a first retardation layer; a second retardation layer positioned below the first retardation layer, wherein the first retardation layer has a λ/2 retardation value, and the second retardation layer has a λ/4 retardation value; a first compensation layer above the first retardation layer; and a second compensation layer below the second retardation layer.

The polarization unit may further include a polarization layer above the first compensation layer.

A thickness direction retardation of the first compensation layer may be the same as that of the second compensation layer, the thickness direction retardation of the second compensation layer may be the same as that of the second retardation layer, and signs thereof may be opposite to each other, the thickness direction retardation of the first compensation layer may be greater than or equal to one-half of that of the second retardation layer, and may be less than or equal to three times of that of the second retardation layer, and signs thereof may be opposite to each other.

The first retardation layer may have an in-plane retardation value for 550 nm wavelength incident light in a range of about 220 nm to about 270 nm, a short-wavelength dispersion value in a range of about 1.04 to about 1.11, and a long-wavelength dispersion value in a range of about 0.90 to about 1.02, and the second retardation layer may have an in-plane retardation value for 550 nm wavelength incident light in a range of about 110 nm to about 150 μm, a short-wavelength dispersion value in a range of about 1.04 to about 1.11, and a long-wavelength dispersion value in a range of about 0.90 to about 1.02.

According to embodiments of the present disclosure, a display device has improved display quality by suppressing color shift through a polarization unit.

In addition, according to embodiments of the present disclosure, a display device has improved flexibility thereof by reducing the thickness of a polarization unit.

DETAILED DESCRIPTION OF EXEMPLARY EMBODIMENTS

Figure 1:
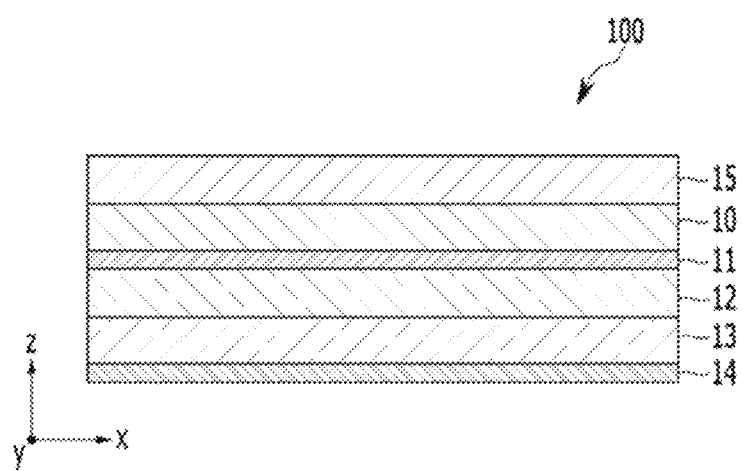
FIG. 1 is a cross-sectional view of a polarization unit according to an exemplary embodiment.

Embodiments of the present disclosure will be described more fully hereinafter with reference to the accompanying drawings, in which exemplary embodiments are shown. As those skilled in the art would realize, the described embodiments may be modified in various different ways, all without departing from the spirit or scope of the present invention.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Hereinafter, a polarization unit 100 according to an exemplary embodiment will be described with reference to FIG. 1.

FIG. 1 is a cross-sectional view of a polarization unit 100 according to an exemplary embodiment. As shown in FIG. 1, the polarization unit 100 includes a polarization layer 10, a plurality of compensation layers 11 and 14, retardation layers 12 and 13 between the plurality of compensation layers 11 and 14, and a passivation layer 15.

According to an embodiment, the passivation layer 15, which protects the polarization layer 10, includes triacetyl cellulose (TAG). The passivation layer 15 may be anti-reflecting or anti glare, or may have a low-reflectivity or a hard coating, etc.

According to an embodiment, the passivation layer 15 uses passivation films that are generally included in a polarizer, without limitations. For example, the passivation film may be one of a cellulose-based film, a polyester-based film, a cyclic polyolefin-based film, a polycarbonate-based film, a polyether sulfone-based film, a polysulfone-based film, a polyamide-based film, a polyimide-based film, a polyolefin-based film, a polyarylate-based film, a polyvinyl alcohol-based film, a polyvinyl chloride-based film, a polychlorinated vinylidene-based film, or a mixture thereof. According to an embodiment, the passivation layer 15 uses a cellulose-based film, such as a triacetyl cellulose-based film.

According to an embodiment, the polarization layer 10 is a linear polarizer which linearly polarizes incident light. The polarization layer 10 includes polyvinyl alcohol (PVA) doped with iodine.

According to an embodiment, the polarization layer 10 may include a film that includes PVA, a layer formed by coating, a metal pattern layer such as a wire grid polarizer (WGP), etc.

According to an embodiment, the polarization layer 10 is positioned on a first compensation layer 11. The polarization layer 10 may be a single layer, or may include two or more sublayers. A thickness of the polarization layer 10 is about 1 μm to about 40 μm.

According to an embodiment, the compensation layers 11 and 14 are films having a z-axis (thickness direction) refractive index that is greater than x-axis and y-axis refractive indices.

According to an embodiment, the compensation layers 11 and 14 of a polarization unit according to an exemplary embodiment are positive C plates. In this case, the compensation layers 11 and 14 have a thickness direction retardation for about 550 nm wavelength incident light in a range of about −200 nm to about −25 nm. When the compensation layers 11 and 14 are positive C plates, the retardation value Rth1 of the thickness direction can be calculated by the following Equation 1.

$$Rth1 = \left(\frac{nx+ny}{2} - nz\right) \times d \qquad \text{(Equation 1)}$$

In Equation 1, d denotes a thickness of the compensation layer, nz denotes a refractive index of a thickness direction of the compensation layer, and nx and ny denote refractive indices for two orthogonal directions in a plane that is perpendicular to the thickness direction of the compensation layer.

Alternatively, according to an embodiment, the compensation layers 11 and 14 of the polarization unit according to the exemplary embodiment are negative C plates. In this case, the compensation layers 11 and 14 have thickness direction retardations for 550 nm wavelength incident light in a range of about 25 nm to about 200 nm. When the compensation layers 11 and 14 are negative C plates, the retardation value Rth2 of the thickness direction can be calculated by the following Equation 2.

$$Rth2 = \left(nz - \frac{nx+ny}{2}\right) \times d \qquad \text{(Equation 2)}$$

In Equation 2, d denotes a thickness of the compensation layer, nz denotes a refractive index of a thickness direction of the compensation layer, and nx and ny denote refractive indices for two orthogonal directions in a plane that is perpendicular to the thickness direction of the compensation layer.

According to an embodiment, compensation layers 11 and 14 are selected as positive C plates or negative C plates depending on the kind of the retardation layers 12 and 13. For example, when the retardation layers 12 and 13 are positive A plates, the compensation layers 11 and 14 are positive C plates. Alternatively, when the retardation layers 12 and 13 are negative A plates, the compensation layers 11 and 14 are negative C plates.

According to an embodiment, an in-plane retardation value (Re) of the compensation layers 11 and 14 can be calculated by the following Equation 3.

$$Re = (nx-ny) \times d \qquad \text{(Equation 3)}$$

In Equation 3, d denotes a thickness of the compensation layer, and ux and ny denote refractive indices for two orthogonal directions in a plane that is perpendicular to the thickness direction of the compensation layer. In the polarization unit 100 according to an exemplary embodiment, the compensation layers 11 and 14 have an in-plane retardation for 550 nm wavelength incident light in a range of about 0 nm to about 3 nm.

According to an embodiment, the thicknesses of the compensation layers 11 and 14 are not particularly limited, but for laminating the polarization layer 10, the thicknesses are in a range of about 0.2 μm to about 3 μm.

According to an embodiment, the compensation layers 11 and 14 are combined with retardation layers 12 and 13 by lamination, coating, deposition, transfer, adhesion, pressure sensitive adhesion (PSA), etc.

According to an embodiment, the retardation layers 12 and 13 can adjust retardation and improve a viewing angle by adjusting optical characteristics of light. The retardation layers 12 and 13 convert linearly polarized light into circularly polarized light, or circularly polarized light into linearly polarized light by retarding two perpendicular polarization components that are parallel to the optical axes of the retardation layers 12 and 13.

According to an embodiment, the two retardation layers 12 and 13 have different in-plane retardation values. For example, the first retardation layer 12 has a λ/2 retardation value, and the second retardation layer 13 has a λ/4 retardation value in this case, the thicknesses of the first retardation layer 12 and the second retardation layer 13 are in a range of about 0.2 μm to about 3 μm.

According to an embodiment, the two retardation layers 12 and 13 are positive A plates in this case, the first retardation layer 12 has a thickness direction retardation for 550 nm wavelength incident light in a range of about 110 nm to about 140 nm. In addition, the second retardation layer 13 has a thickness direction retardation for 550 nm wavelength incident light in a range of about 50 nm to about 80 nm.

Alternatively, according to an embodiment, the two retardation layers 12 and 13 are negative A plates. In this case, the first retardation layer 12 has a thickness direction retardation for 550 nm wavelength incident light in a range of about −140 nm to about −110 nm. In addition, the second retardation layer 13 has a thickness direction retardation for 550 nm wavelength incident light in a range of about −80 nm to about −50 nm.

According to an embodiment, the first retardation layer 12 has an in-plane retardation value of λ/2 and a positive wavelength dispersion characteristic. The first retardation layer 12 has an in-plane retardation for 550 nm wavelength incident light in a range of about 220 nm to about 270 nm. In this case, a positive wavelength dispersion characteristic means that an in-plane retardation value for short wavelength light is equal to or greater than an in-plane retardation value for long wavelength light.

Specifically, according to an embodiment, the short-wavelength dispersion value of the first retardation layer 12 is in a range of about 1.04 to about 1.11. In addition, the long-wavelength dispersion value of the first retardation layer 12 is in a range of about 0.90 to about 1.02.

Hereinafter, according to an embodiment, it is assumed that the short-wavelength dispersion value is a ratio of the in-plane retardation for 550 nm wavelength incident light and an in-plane retardation value for 450 nm wavelength incident light. Furthermore, it is assumed that the long-wavelength dispersion value is a ratio of the in-plane retardation for 550 nm wavelength incident light and an in-plane retardation value for 650 nm wavelength incident light.

In addition, according to an embodiment, the first retardation layer 12 and the polarization layer 10 are tilt-aligned so that an angle between an optical axis of the first retardation layer 12 and an absorption axis of the polarization layer 10 are about −20° to about −10° or about 10° to about 20°.

According to an embodiment, the second retardation layer 13 has an in-plane retardation value of λ/4 and a positive wavelength dispersion characteristic.

According to an embodiment, the in-plane retardation of the second retardation layer 13 for incident light of a wavelength of about 550 nm is in a range of about 110 nm to about 150 nm. The short-wavelength dispersion value of the second retardation layer 13 is in a range of about 1.04 to about 1.11. The long-wavelength dispersion value of the second retardation layer 13 is in a range of about 0.90 to about 1.02.

In addition, according to an embodiment, the second retardation layer 13 and the polarization layer 10 are tilt-aligned so that an angle between an optical axis of the second retardation layer 13 and an absorption axis of the polarization layer 10 is about −80° to about −70° or about 70° to about 80°.

According to an embodiment, the retardation layers 12 and 13 are positioned between the plurality of compensation layers 11 and 14. The first compensation layer 11 is positioned above the first retardation layer 12, and the second compensation layer 14 is positioned below the second retardation layer 13.

For example, according to an embodiment, a positive C plate is coated on one surface of the first retardation layer 12, and a positive C plate is coated on one surface of the second retardation layer 13. The other surface of the first retardation layer 12 and the other surface of the second retardation layer 13 are combined with each other. In this case, the other surfaces of the first retardation layer 12 and the second retardation layer 13 are combined by adhesion, pressure sensitive adhesion (PSA), lamination, etc.

As the retardation layers 12 and 13 are typically used in the polarizer for an organic light emitting diode display, retardation films may be used without limitations. A film made of an acrylic-based material, a polycarbonate-based material, a polystyrene-based material, a polyimide-based material, a cellulose-based material, an olefin-based material, a cycloolefin polymer-based material, or a mixture thereof may be used for the retardation layers 12 and 13. In particular, a film made of an acrylic-based material, a polycarbonate-based material, or a cycloolefin polymer-based material can be used.

In the polarization unit 100 of an exemplary embodiment, a positive A plate type retardation layer 12 has a thickness direction retardation in a range of about 110 nm to about 140 nm. A positive A plate type retardation layer 13 has a thickness direction retardation in a range of about 50 nm to about 80 nm. The thickness direction retardation of the polarization unit 100 is increased by the thickness direction retardation of the first retardation layer 12 and the thickness direction retardation of the second retardation layer 13. Since the positive C plate type compensation layers 11 and 14 have a thickness direction retardation in a range of about −200 nm to about −25 nm, the thickness direction retardation of the polarization unit 100 is decreased by laminating the compensation layers 11 and 14.

In the polarization unit 100 of an exemplary embodiment, a negative A plate type retardation layer 12 has a thickness direction retardation in a range of about −140 nm to about −110 nm. A negative A plate type retardation layer 13 has a thickness direction retardation in a range of about −80 nm to about −50 nm. The thickness direction retardation of the polarization unit 100 increases in a negative direction due to the thickness direction retardation of the first retardation layer 12 and the thickness direction retardation of the second retardation layer 13. Since the negative C plate type compensation layers 11 and 14 have a thickness direction retardation of about 25 nm to about 200 nm, the thickness direction retardation of the polarization unit 100 is decreased by laminating the compensation layers 11 and 14.

When the compensation layers 11 and 14 that compensate the thickness direction retardation of the retardation layers 12 and 13 are laminated, the thickness direction retardation of the polarization unit 100 decreases, which decreases differences based on viewing angles. Accordingly, a side viewing angle of the polarization unit 100 according to an exemplary embodiment may be improved.

The polarization unit 100 of FIG. 1 can be used in a display device, particularly, in a flat panel display such as an organic light emitting diode display, a liquid crystal display, etc. This will be described below with reference to FIG. 18 and FIG. 19.

Now, a color shift for each viewing angle of a polarization unit according to examples and comparative examples will be described in detail with reference to FIG. 2 to FIG. 17.

First, a color shift distribution of a polarization unit according to a comparative example will be described.

Figure 2:
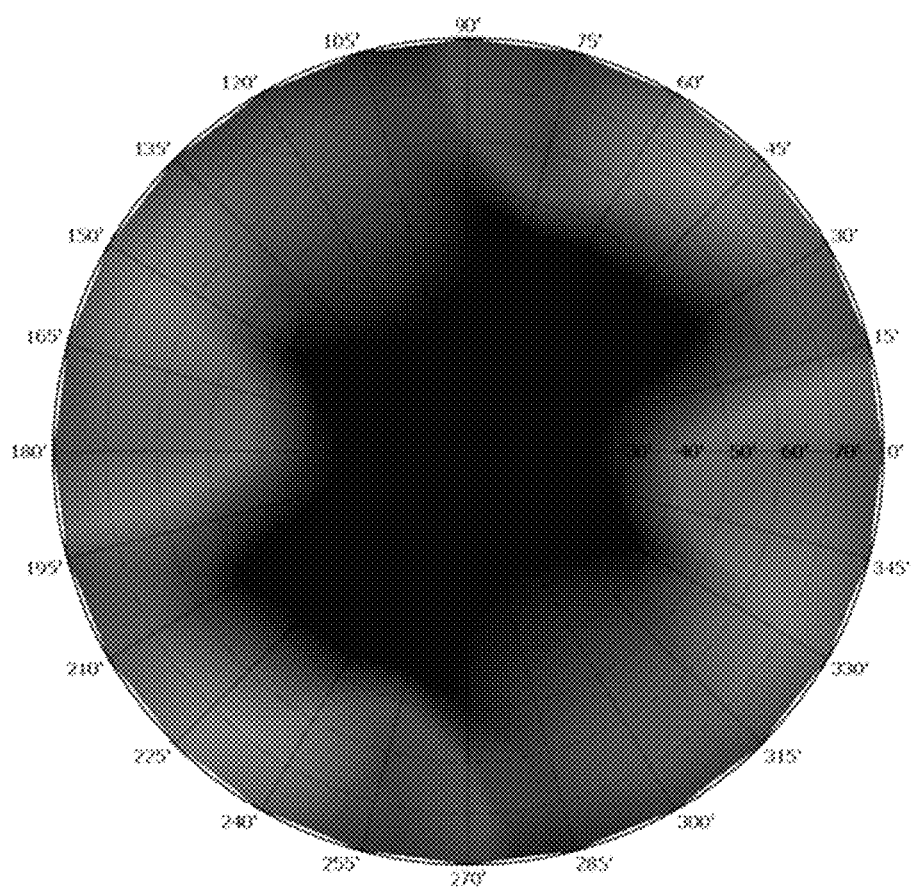
FIG. 2 and FIG. 3 respectively illustrate a color shift distribution for each viewing angle of a polarization unit of a first comparative example.
Figure 3:
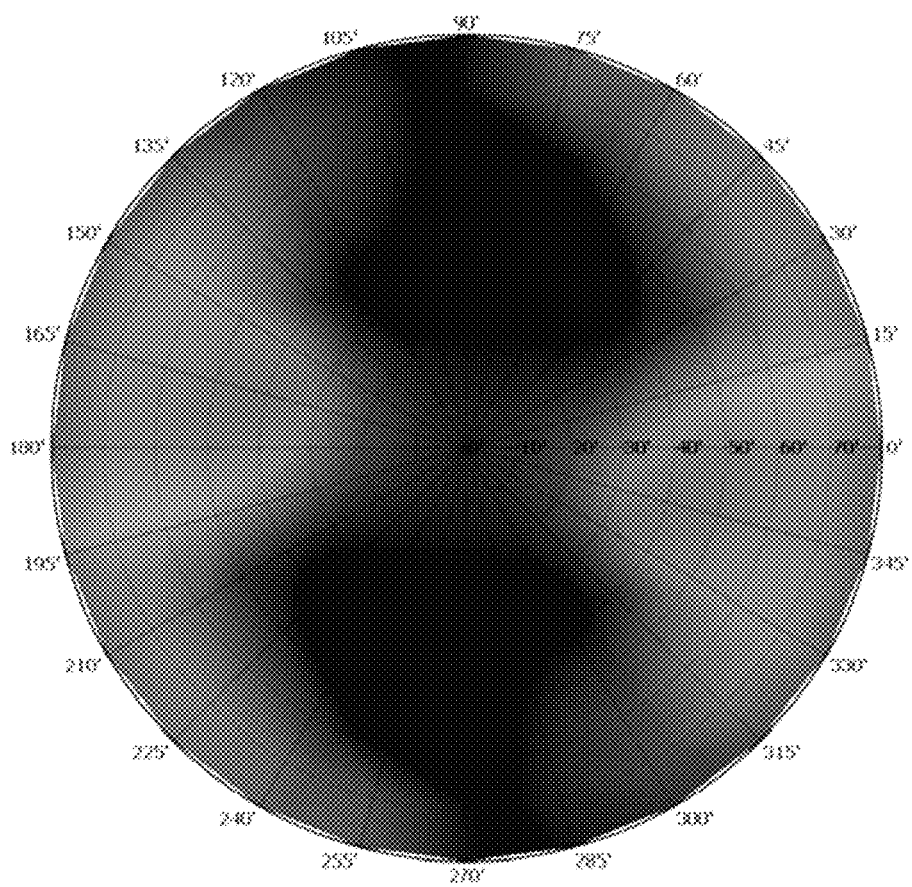
Figure 4:
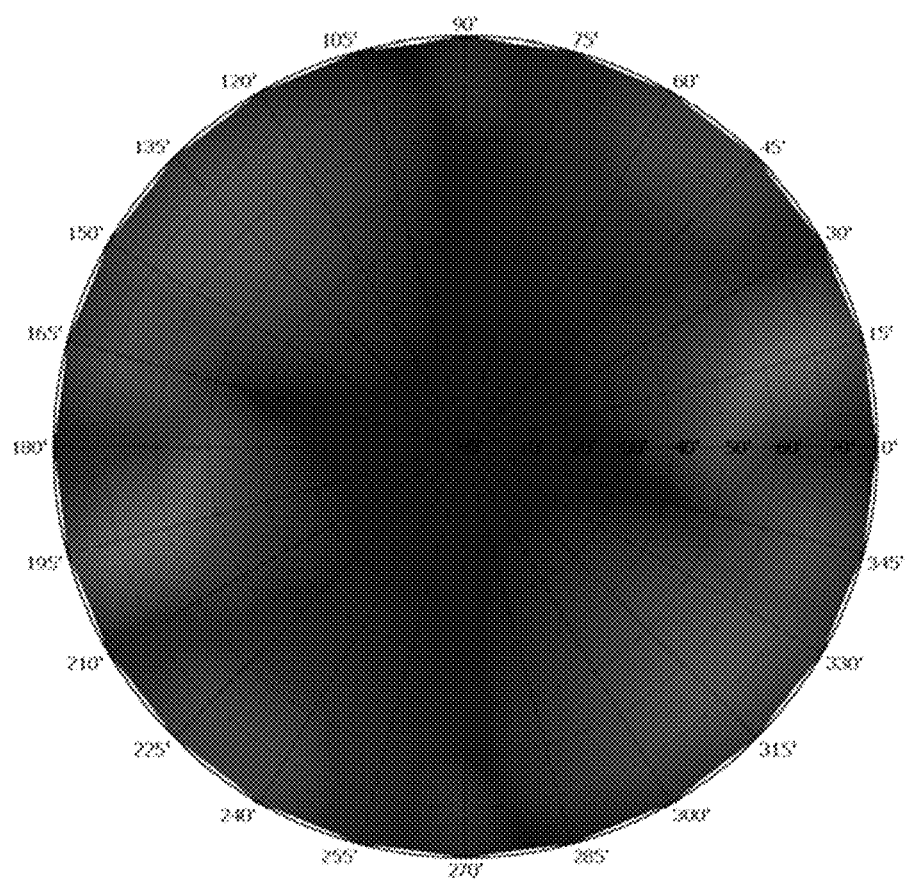
FIG. 4 and FIG. 5 respectively illustrate color shift distribution for each viewing angle of a polarization unit of a second comparative example.
Figure 5:
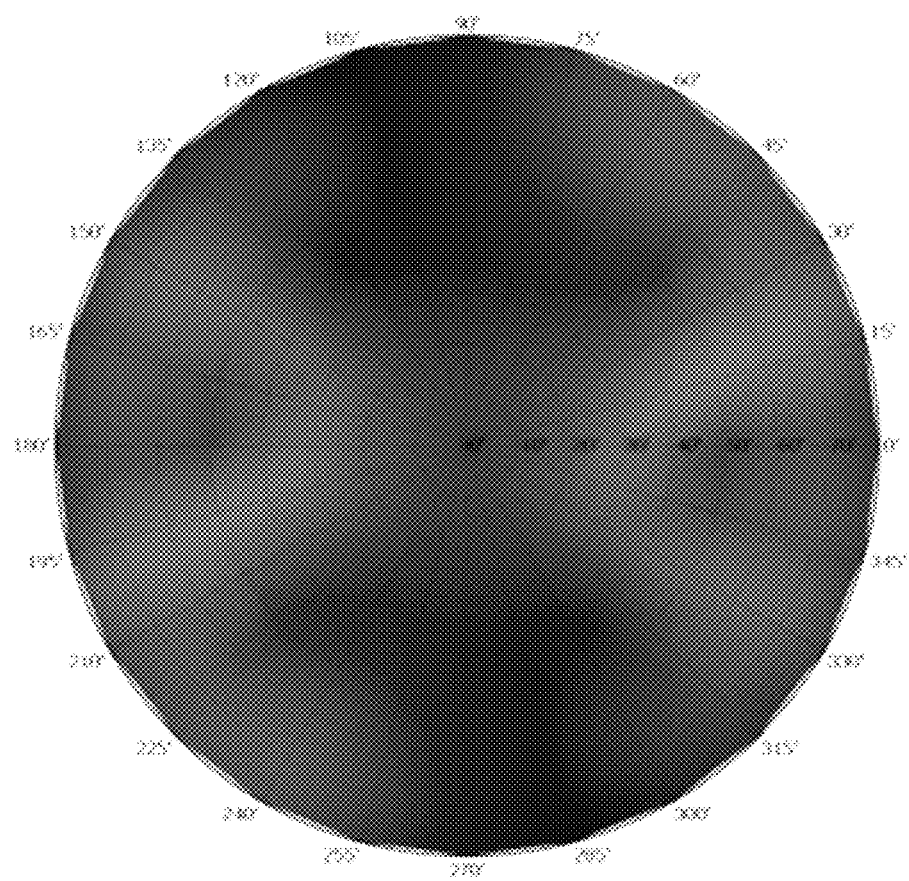
Figure 6:
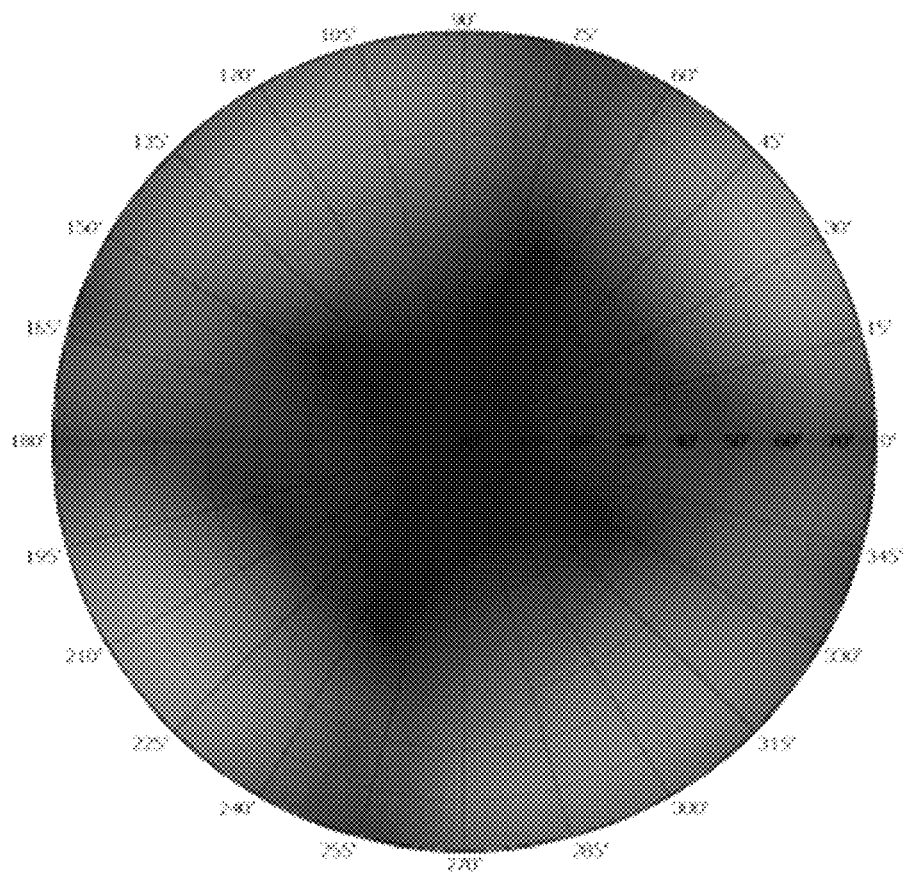
FIG. 6 and FIG. 7 respectively illustrate a color shift distribution for each viewing angle of a polarization unit of a third comparative example.
Figure 7:
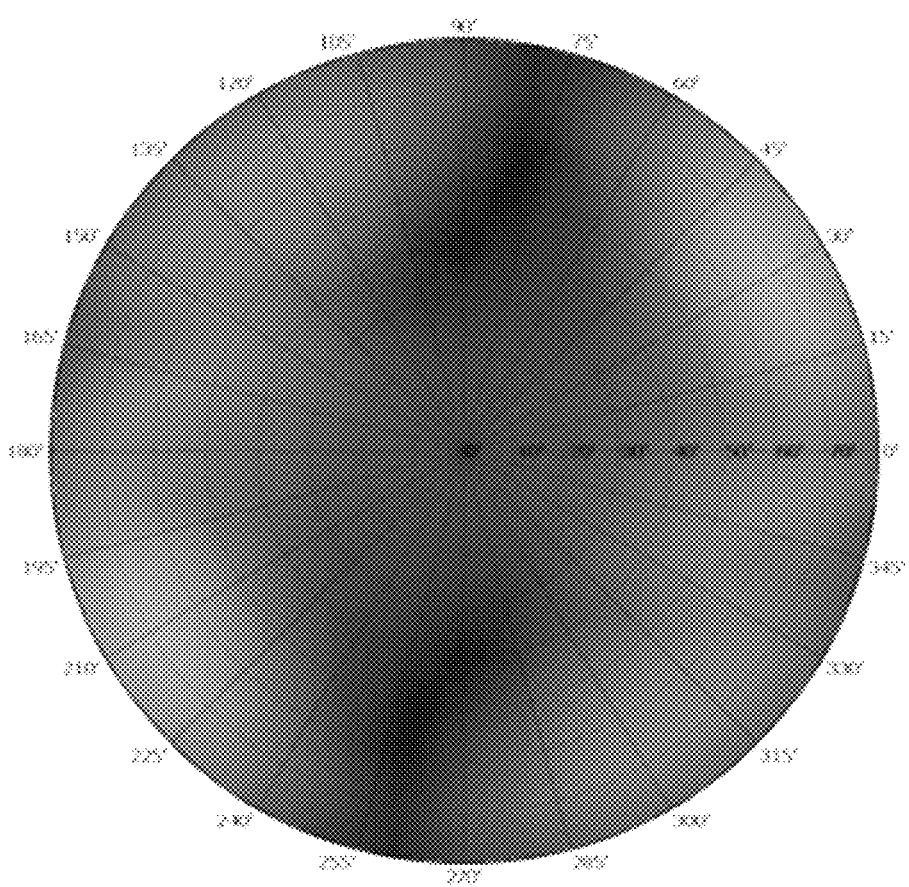
Figure 8:
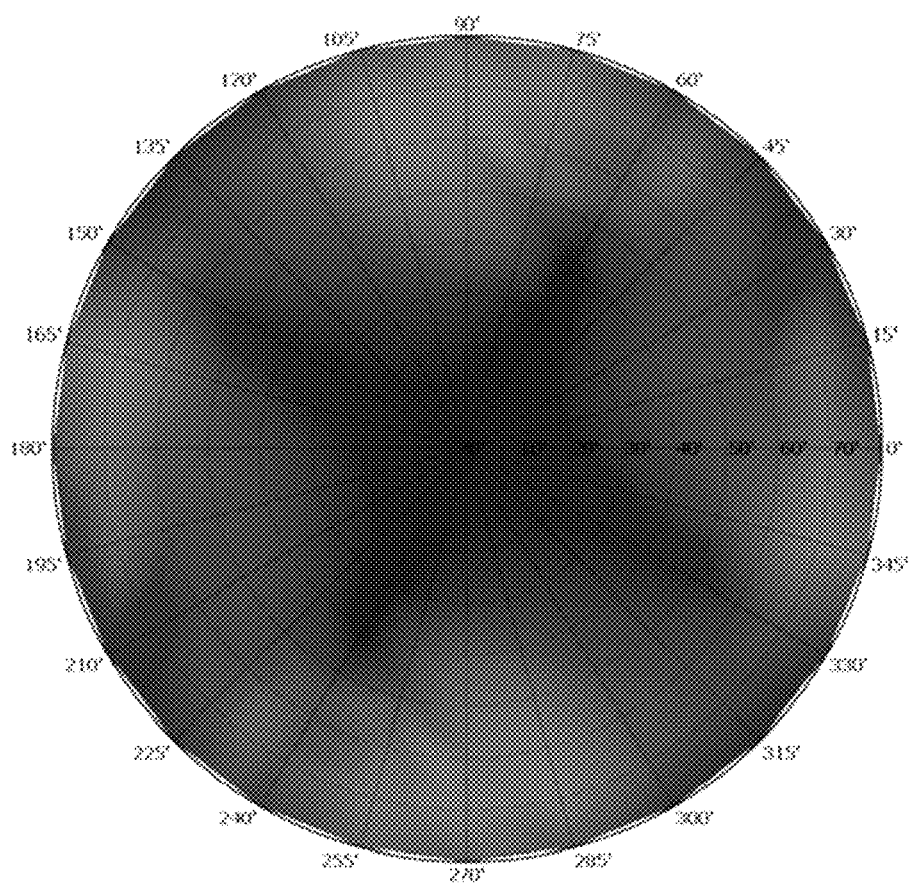
FIG. 8 and FIG. 9 respectively illustrate a color shift distribution for each viewing angle of a polarization unit of a fourth comparative example.
Figure 9:
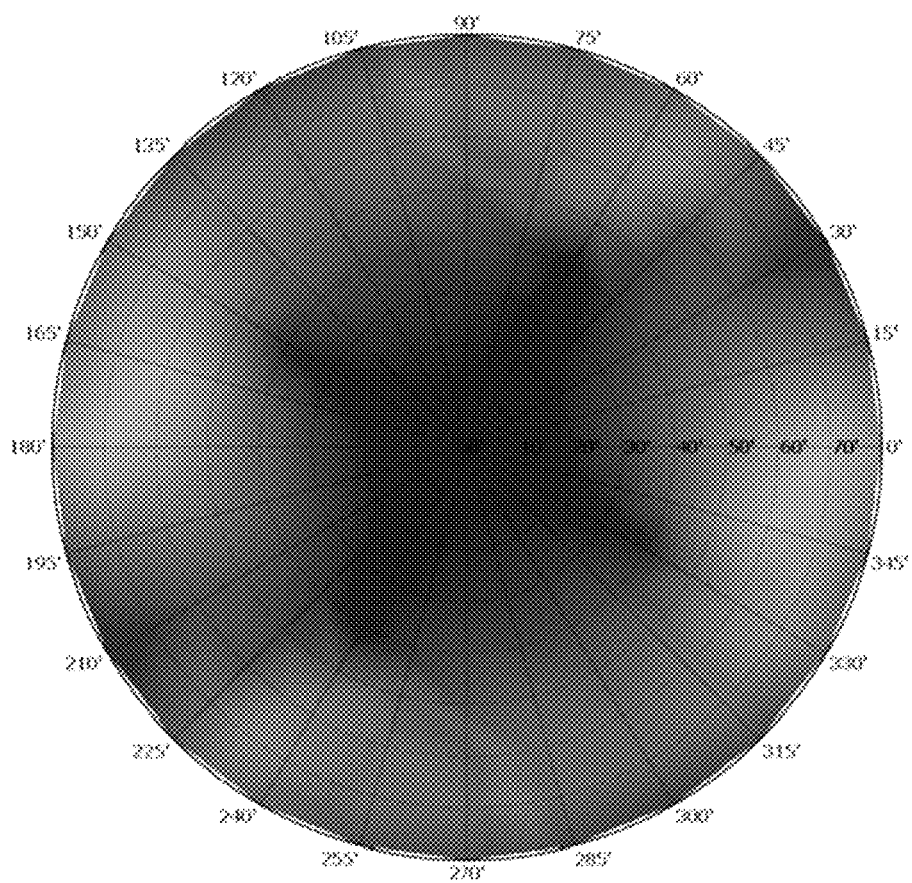

FIG. 2 and FIG. 3 respectively illustrate a color shift distribution for each viewing angle of a polarization unit of a first comparative example, FIG. 4 and FIG. 5 respectively illustrate a color shift distribution for each viewing angle of a polarization unit of a second comparative example, FIG. 6 and FIG. 7 respectively illustrate a color shift distribution for each viewing angle of a polarization unit of a third comparative example, and FIG. 8 and FIG. 9 respectively illustrate a color shift distribution for each viewing angle of a polarization unit of a fourth comparative example.

A polarization unit according to a first comparative example lacks the compensation layers 11 and 14 in FIG. 1, the polarization unit according to the second comparative example lacks the first compensation layer 11 in FIG. 1, the polarization unit according to the third comparative example lacks the second compensation layer 14 in FIG. 1, and the polarization unit according to the fourth comparative example has one compensation layer positioned between the retardation layers 12 and 13 of the first comparative example.

In each polarization, unit of an exemplary embodiment and of the first to fourth comparative examples, a thickness of the polarization layer 10 is about 33 μm, a thickness of the first retardation layer 12 is about 2 μm, and a thickness of the second retardation layer 13 is about 1 μm.

In each polarization unit 100 of an exemplary embodiment and the first to fourth comparative examples, the first retardation layer 12 has an in-plane retardation for 550 nm wavelength incident light of about 260 nm, and the thickness direction retardation thereof for 550 nm wavelength incident light is about 130 nm.

In each polarization unit 100 of an exemplary embodiment and the first to fourth comparative examples, the first retardation layer 12 has a short-wavelength dispersion value of about 1.10, and a long-wavelength dispersion value of about 0.95.

In each polarization unit 100 of an exemplary embodiment and the first to fourth comparative examples, the first retardation layer 12 has an in-plane retardation for 550 nm wavelength incident light of about 13 nm, and a thickness direction retardation thereof for 550 nm wavelength incident light of about 65 nm.

In each polarization unit 100 of an exemplary embodiment and the first to fourth comparative examples, the second retardation layer 13 has a short-wavelength dispersion value of about 1.10, and a long-wavelength dispersion value of about 0.95.

In each polarization unit 100 of an exemplary embodiment and the first to fourth comparative examples, the angle between the optical axis of the first retardation layer 12 and the absorption axis of the polarization layer 10 is about 15°, and the angle between the optical axis of the positive wavelength dispersing second retardation layer 13 and the absorption axis of the polarization layer 10 is about 75°.

The compensation layers of the polarization units according to the second comparative example, the third comparative example, and the fourth comparative example have a thickness direction retardation thereof for 550 nm wavelength incident light of about 65 nm.

FIG. 2, FIG. 4, FIG. 6, and FIG. 8 illustrate color shift distributions when the two retardation layers 12 and 13 of the polarization units 100 according to the first to fourth comparative examples are combined with a phase axis of the same angle. As shown in FIG. 2, FIG. 4, FIG. 6, and FIG. 8, as the viewing angle changes, a color shift phenomenon occurs in which the colors change to red, blue, green, etc.

FIG. 3, FIG. 5, FIG. 7, and FIG. 9 illustrate color shift distributions when the phase axes of the two retardation layers 12 and 13 of the polarization unit 100 according to the first to ail fourth comparative examples form an angle of about 5° with respect to each other. When the polarization unit 100 is manufactured, the phase axis of the first retardation layer 12 and the phase axis of the second retardation layer 13 are combined so that an angle formed by them is within about 5°. As shown in FIG. 3, FIG. 5, FIG. 7, and FIG. 9, as the viewing angle changes, a color shift phenomenon occurs in which the colors change to red, blue, green, etc.

Next, with reference to a color shift distribution of the polarization unit 100 according to the first to fourth aspects based of an exemplary embodiment, effects of an exemplary embodiment will be described.

Figure 10:
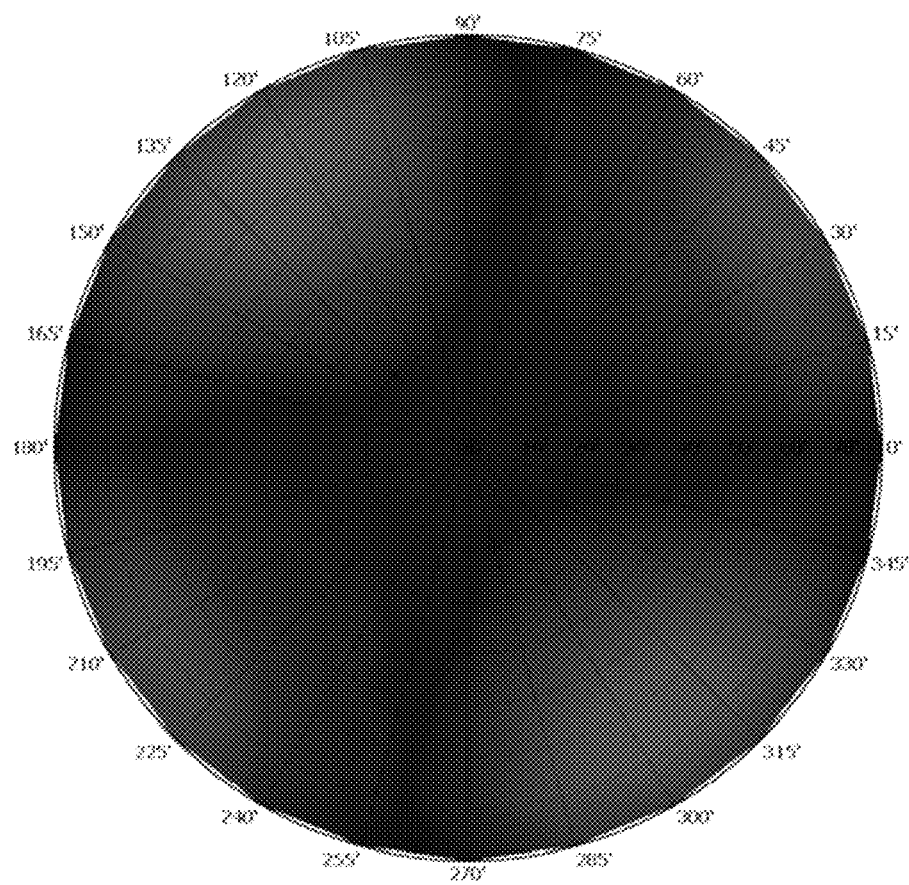
FIG. 10 and FIG. 11 respectively illustrate a color shift distribution for each viewing angle of a polarization unit of a first example according to an exemplary embodiment.
Figure 11:
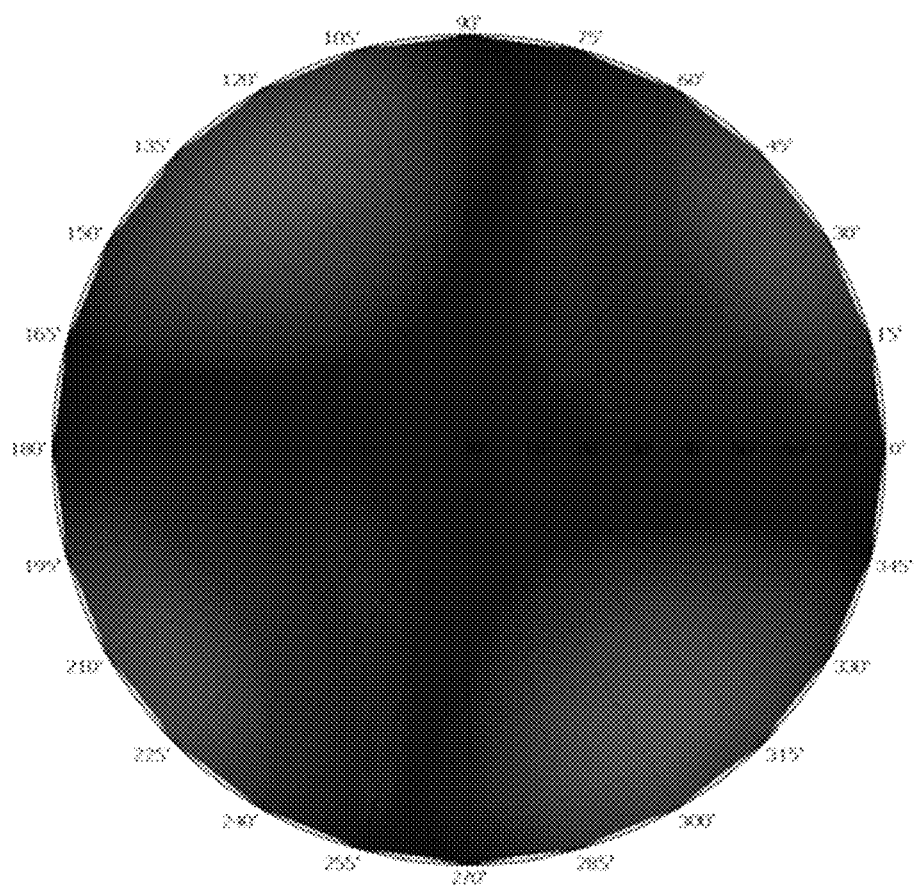
Figure 12:
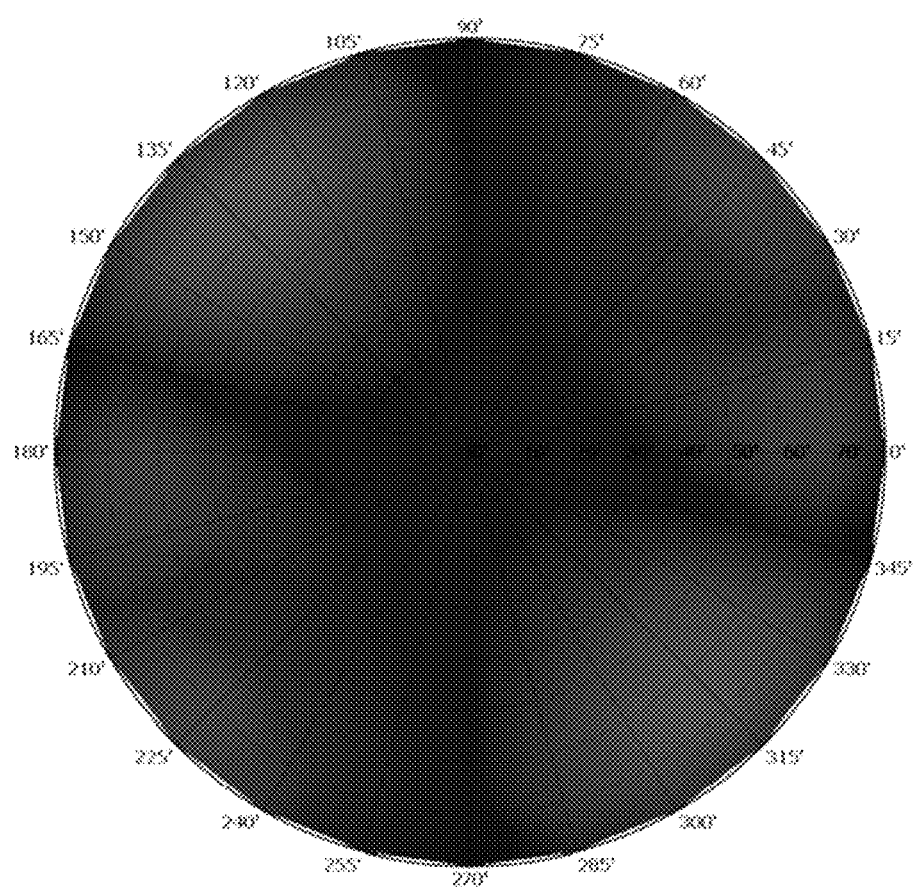
FIG. 12 and FIG. 13 respectively illustrate a color shift distribution for each viewing angle of a polarization unit of a second example according to an exemplary embodiment.
Figure 13:
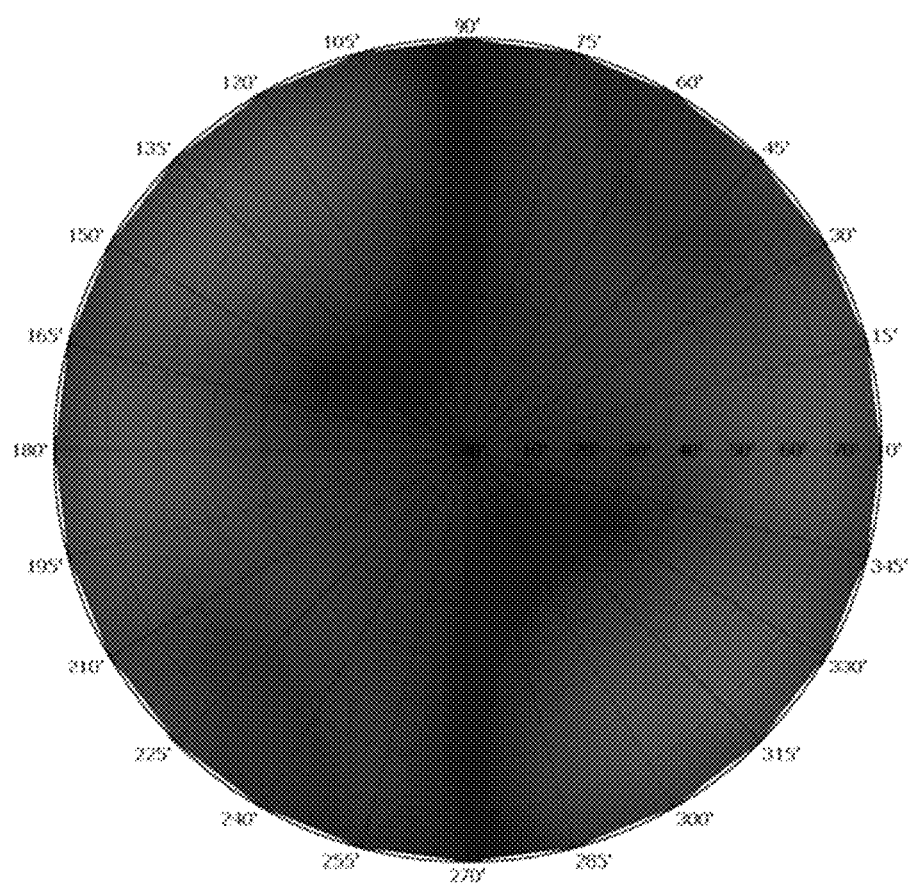
Figure 14:
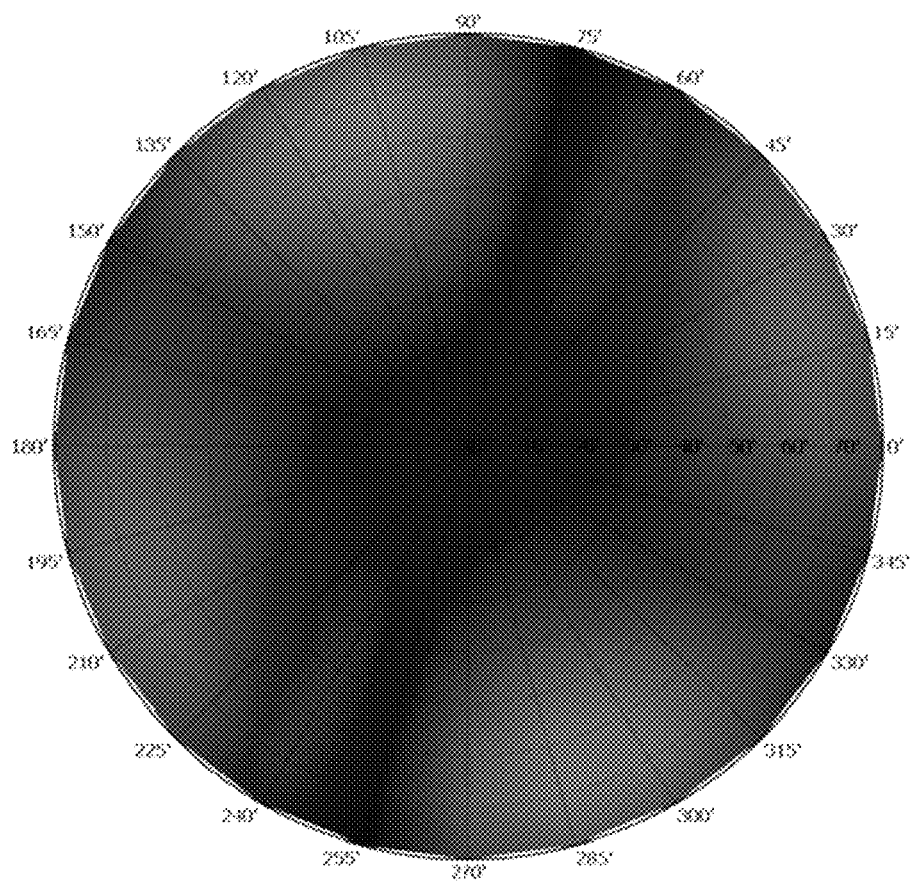
FIG. 14 and FIG. 15 respectively illustrate a color shift distribution for each viewing angle of a polarization unit of a third example according to an exemplary embodiment.
Figure 15:
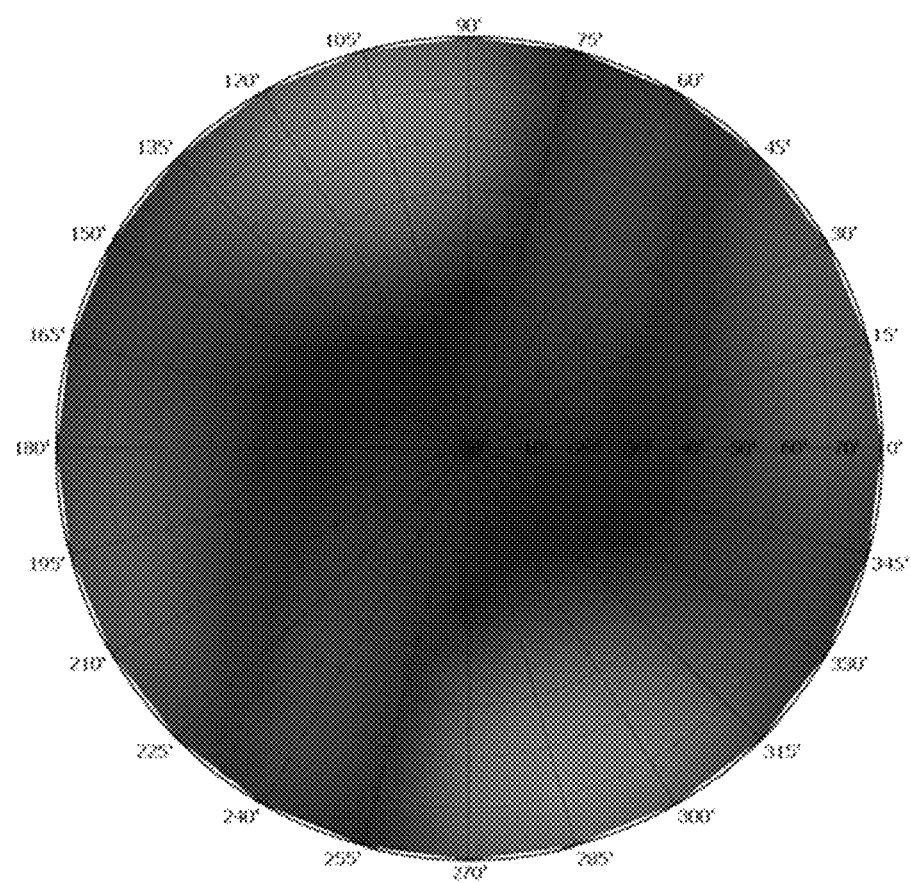
Figure 16:
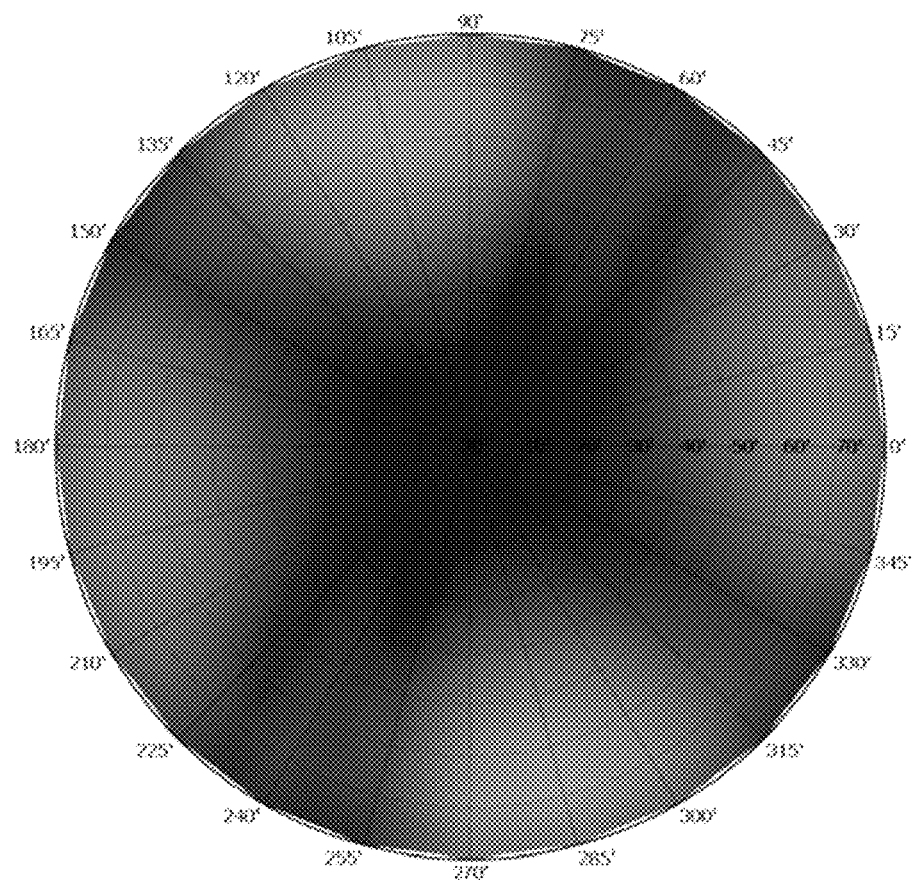
FIG. 16 and FIG. 17 respectively illustrate a color shift distribution for each viewing angle of a polarization unit of a fourth example according to an exemplary embodiment.
Figure 17:
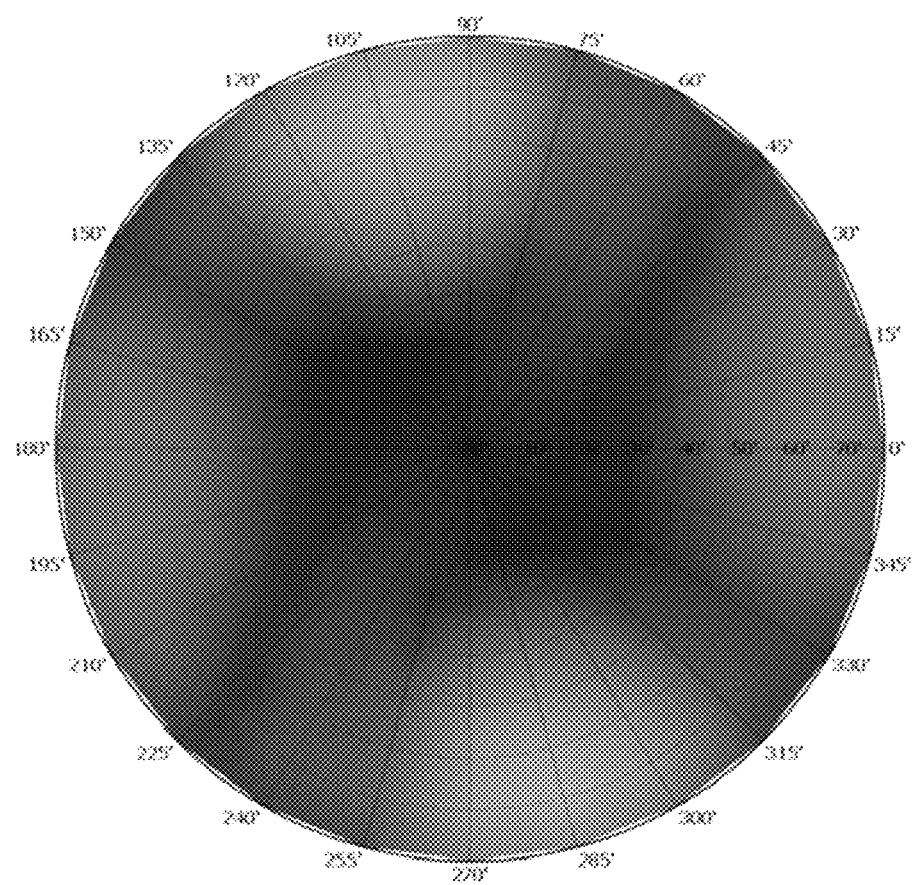

FIG. 10 and FIG. 11 respectively illustrate a color shift distribution for each viewing angle of a polarization unit 100 of a first example, FIG. 12 and FIG. 13 respectively illustrate a color shift distribution for each viewing angle of a polarization unit 100 of a second example, FIG. 14 and FIG. 15 respectively illustrate a color shift distribution for each viewing angle of a polarization unit 100 of a third example, and FIG. 16 and FIG. 17 respectively illustrate a color shift distribution for each viewing angle of a polarization unit 100 of a fourth example.

The polarization unit 100 according to an exemplary embodiment has a structure as shown in FIG. 1. The thickness direction retardation of the compensation layers 11 and 14 of the polarization unit 100 has a predetermined ratio with respect to the thickness direction retardation of the second retardation layer 13. The predetermined ratio varies depending on a design and is thus not limited to a specific value.

The polarization unit 100 according to a first aspect has a thickness direction retardation of the first compensation layer 11 that is the same as the thickness direction retardation of the second retardation layer 13. For example, in the first compensation layer 11 and the second compensation layer 14 of the polarization unit 100 according to a first aspect, the thickness direction retardation for 550 nm wavelength incident light is about −65 nm.

The polarization unit 100 according to a second aspect has a thickness direction retardation of the first compensation layer 11 that is about one-half the thickness direction retardation of the second retardation layer 13. For example, in the polarization unit 100 according to a second aspect, the thickness direction retardation of the first compensation layer 11 for 550 nm wavelength incident light is about −32 nm, and the thickness direction retardation of the second compensation layer 14 for 550 nm wavelength incident light is about −65 nm.

The polarization unit 100 according to a third aspect has a thickness direction retardation of the first compensation layer 11 that is about two times the thickness direction retardation of the second retardation layer 13. For example, in the polarization unit 100 according to a third aspect, the thickness direction retardation of the first compensation layer 11 for 550 nm wavelength incident light is about −130 nm, and the thickness direction retardation of the second compensation layer 14 for 550 nm wavelength incident light is about −65 nm. The polarization unit 100 according to a fourth aspect has a thickness direction retardation of the first compensation layer 11 that is about three times the thickness direction retardation of the second retardation layer 13. For example, in the polarization unit 100 according to a fourth aspect, the thickness direction retardation of the first compensation layer 11 for 550 nm wavelength incident light is about −195 nm, and the thickness direction retardation of the second compensation layer 14 for 550 nm wavelength incident light is about −65 nm.

FIG. 10, FIG. 12, FIG. 14, and FIG. 16 illustrate color shift distributions when two retardation layers 12 and 13 of the polarization units 100 according to exemplary embodiments are combined with a phase axis of the same angle. As shown in FIG. 10, FIG. 12, FIG. 14, and FIG. 16, the colors change to dark blue or light blue based on the viewing angle. Accordingly, a degree of a color shift according to exemplary embodiments is less than a degree of a color shift according to the comparative examples.

FIG. 11, FIG. 13, FIG. 1.5, and FIG. 17 illustrate color shift distributions when the phase axes of the two retardation layers 12 and 13 of the polarization unit 100 according to exemplary embodiments form an angle of about 5° with respect to each other. Although the phase axes of the two retardation layers 12 and 13 form an angle of about 5°, the colors change to dark blue or light blue based on the viewing angle. Accordingly, even when the phase axes of the two retardation layers 12 and 13 form an angle, a degree of a color shift according to exemplary embodiments is less than a degree of a color shift according to the comparative examples.

A value of the color shift can be calculated by using an "a" value of a horizontal axis and a "b" value of a vertical axis in a CIE-Lab color coordinate system, and a positive "a" value represents red, a negative "a" value represents green, a positive "b" value represents yellow, and a negative "b" value represents blue.

According to an embodiment, a value (ΔE) of the color shift can be calculated by the following Equation 4.

$$\Delta E = \sqrt{\Delta a^2 + \Delta b^2} \quad \text{(Equation 4)}$$

In Equation 4, ΔE denotes a color shift value, Δa denotes a deviation of the "a" value in the CIE color coordinate system, and Δb denotes a deviation of the "b" value in the CIE color coordinate system. The color shift improves as ΔE decreases.

According to a first to fourth aspects of an exemplary embodiment and the first to fourth comparative examples, color shift values at a polar angle of 45° and color shift values at a polar angle of 60° are shown in Table 1.

TABLE 1

|  | 45°ΔE | | 60°ΔE | |
| --- | --- | --- | --- | --- |
| Tilt angle | 0° | 5° | 0° | 5° |
| First comparative example | 5.55 | 8.14 | 11.38 | 13.40 |
| Second comparative example | 4.46 | 4.84 | 8.32 | 8.34 |
| Third comparative example | 8.98 | 10.38 | 10.62 | 16.39 |
| Fourth comparative example | 2.86 | 5.50 | 6.09 | 6.17 |
| First aspect | 0.19 | 1.33 | 0.56 | 0.55 |
| Second aspect | 2.75 | 3.05 | 2.77 | 3.82 |
| Third aspect | 1.08 | 2.74 | 1.68 | 3.12 |
| Fourth aspect | 2.91 | 3.58 | 5.99 | 6.64 |

As shown in Table and FIG. 2 to FIG. 17, when the polarization unit 100 of an exemplary embodiment is compared to the polarization units of the comparative examples, color shift values corresponding to a polar angle of 45°, color shift values corresponding to a polar angle of 60°, and the color shift values corresponding to polar angles of 45° and 60° when the phase axes of the two retardation layers 12 and 13 form an angle of about 5°, are relatively small, thereby improving the side viewing angle.

Specifically, a color shift value corresponding to a polar angle of 45° according to a first aspect decreases by about 5.36 compared to the first comparative example, decreases by about 4.27 compared to the second comparative example, decreases by about 8.79 compared to the third comparative example, and decreases by about 2.67 compared to the fourth comparative example. When a polarization unit according to a first aspect is compared to a polarization unit according to the first to fourth comparative examples, a side color shift is improved.

Hereinafter, an organic light emitting diode display that incorporates a laminated polarization unit 100 of an exemplary embodiment will be described with reference to FIG. 18 and FIG. 19.

Figure 18:
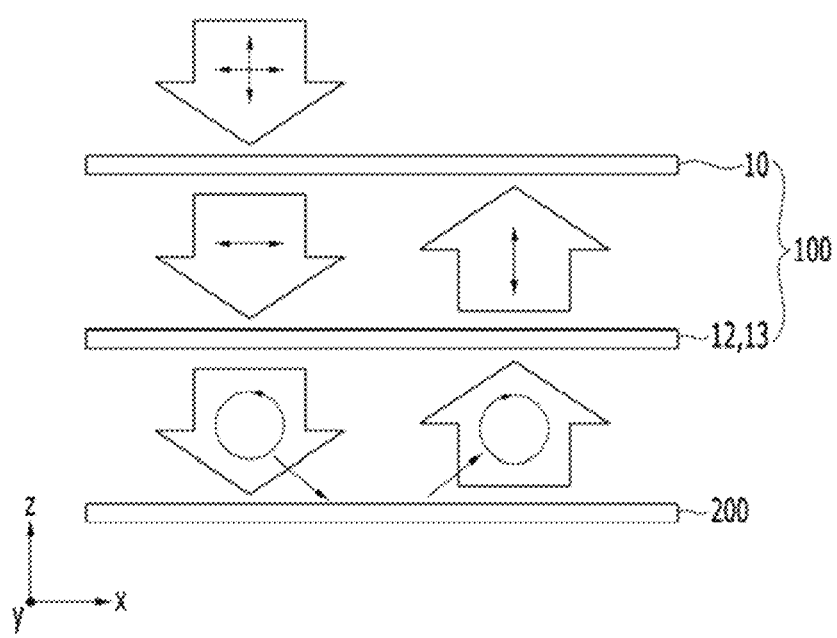
FIG. 18 is a schematic view that illustrates an antireflective principle of a polarization unit according to an exemplary embodiment.
Figure 19:
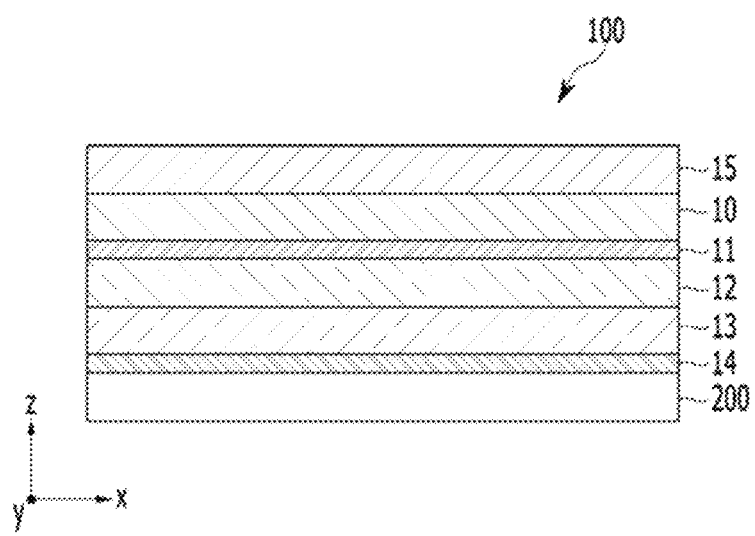
FIG. 19 is a cross-sectional view of an organic light emitting diode display that includes a polarization unit according to an exemplary embodiment.

FIG. 18 is a schematic view that illustrates an antireflective principle of the polarization unit 100 according to an exemplary embodiment, and FIG. 19 is a cross-sectional view of an organic light emitting diode display that includes the polarization unit 100 according to an exemplary embodiment.

According to an embodiment, as shown in FIG. 18 and FIG. 19, a organic light emitting diode display includes an organic light emitting panel 200 and a polarization unit 100 positioned on one surface of the organic light emitting panel 200. The organic light emitting panel 200 includes a substrate, an electrode, etc.

According to an embodiment, as shown in FIG. 18, when non-polarized external incident light passes through the polarization layer 10, only one of two polarized perpendicular components is transmitted. When polarized light passes through the retardation layers 12 and 13, it is transformed into circularly polarized light.

According to an embodiment, when circularly polarized light is reflected from the organic light emitting panel 200, the direction of circular polarization changes. When the directionally changed circularly polarized light passes through the retardation layers 12 and 13 again, only the other of the two polarized perpendicular components is transmitted.

According to an embodiment, one of the two polarized perpendicular components does not pass through the polarization layer 10, thus no light is emitted outward, thereby preventing the external light from being reflected.

According to an embodiment, the polarization unit 100 shown in FIG. 19 includes the polarization layer 10, the retardation layers 12 and 13, the compensation layers 11 and 14, and the passivation layer 15. Since the polarization unit 100 is the same as that of FIG. 1, a detailed description thereof will be omitted.

The polarization unit 100 and an organic light emitting diode display according to an exemplary embodiment that includes the same have an excellent color shift prevention characteristics, and thus decrease dependence on the viewing angle.

While embodiments of this disclosure have been described. In connection with what is presently considered to be practical exemplary embodiments, it is to be understood that the embodiments are not limited to exemplary embodiments, but, on the contrary, are intended to cover various modifications and equivalent arrangements included within the spirit and scope of the appended claims.

What is claimed is:

1. A polarization unit, comprising:
a plurality of retardation layers that each have a different retardation value;
a polarization layer above the plurality of retardation layers;
a first compensation layer between the polarization layer and the plurality of retardation layers; and
a second compensation layer below the plurality of retardation layers.

2. The polarization unit of claim 1, wherein
a thickness direction retardation of the first compensation layer is the same as that of the second compensation layer.

3. The polarization unit of claim 1, wherein
a plurality of retardation layers include a first retardation layer and a second retardation layer positioned below the first retardation layer,
the thickness direction retardation of the second compensation layer is the same as that of the second retardation layer, and signs thereof are opposite to each other.

4. The polarization unit of claim 3, wherein
a thickness direction retardation of the first compensation layer is greater than or equal to one-half of the thickness direction retardation of the second retardation layer, and is less than or equal to three times of the thickness direction retardation of the second retardation layer, and signs thereof are opposite to each other.

5. The polarization unit of claim 3, wherein
the first retardation layer has a λ/2 retardation value, and the second retardation layer has a λ/4 retardation value.

6. The polarization unit of claim 5, wherein
the first retardation layer has an in-plane retardation value for 550 nm wavelength incident light in a range of about 220 nm to about 270 nm, a short-wavelength dispersion value in a range of about 1.04 to about 1.11, and a long-wavelength dispersion value in a range of about 0.90 to about 1.02.

7. The polarization unit of claim 6, wherein
the second retardation layer has an in-plane retardation value for 550 nm wavelength incident light in a range of about 110 nm to about 150 nm, a short-wavelength dispersion value in a range of about 1.04 to about 1.11, and a long-wavelength dispersion value in a range of about 0.90 to about 1.02.

8. The polarization unit of claim 1, wherein
a thickness of each of the first retardation layer and the second retardation layer is in a range of about 0.2 μm to about 3 μm, and
a thickness of the polarization layer is in a range of about 1 μm to about 40 μm.

9. An organic light emitting diode display, comprising:
a display panel; and
a polarization unit positioned on the display panel,
wherein the polarization unit includes:
a plurality of retardation layers that each have a different retardation value;
a polarization layer positioned above the plurality of retardation layers;
a first compensation layer positioned between the polarization layer and the plurality of retardation layers; and
a second compensation layer positioned below the plurality of retardation layers.

10. The organic light emitting diode display of claim 9, wherein
a thickness direction retardation of the first compensation layer is the same as that of the second compensation layer.

11. The organic light emitting diode display of claim 9, wherein
a plurality of retardation layers include a first retardation layer and a second retardation layer positioned below the first retardation layer, and
the thickness direction retardation of the second compensation layer is the same as that of the second retardation layer.

12. The organic light emitting diode display of claim 11, wherein
a thickness direction retardation of the first compensation layer is greater than or equal to one-half of the thickness direction retardation of the second retardation layer, and is less than or equal to three times of the thickness direction retardation of the second retardation layer.

13. The organic light emitting diode display of claim 11, wherein
the first retardation layer has a λ/2 retardation value, and the second retardation layer has a λ/4 retardation value.

14. The organic light emitting diode display of claim 13, wherein
the first retardation layer has an in-plane retardation value for 550 nm wavelength incident light in a range of about 220 nm to about 270 nm, a short-wavelength dispersion value in a range of about 1.04 to about 1.11, and a long-wavelength dispersion value in a range of about 0.90 to about 1.02.

15. The organic light emitting diode display of claim 14, wherein
the second retardation layer has an in-plane retardation for 550 nm wavelength incident light in a range of about 110 nm to about 150 nm, a short-wavelength dispersion value in a range of about 1.04 to about 1.11, and a long-wavelength dispersion value in a range of about 0.90 to about 1.02.

16. The organic light emitting diode display of claim 9, wherein
a thickness of each of the first retardation layer and the second retardation layer is in a range of about 0.2 μm to about 3 μm, and
a thickness of the polarization layer is in a range of about 1 μm to about 40 μm.

17. A polarization unit, comprising:
a first retardation layer;
a second retardation layer positioned below the first retardation layer, wherein the first retardation layer has a λ/2 retardation value, and the second retardation layer has a λ/4 retardation value;
a first compensation layer above the first retardation layer; and
a second compensation layer below the second retardation layer.

18. The polarization unit of claim 17, further comprising a polarization layer above the first compensation layer.

19. The polarization unit of claim 17, wherein
a thickness direction retardation of the first compensation layer is the same as a thickness direction retardation of the second compensation layer,
the thickness direction retardation of the second compensation layer is the same as a thickness direction retardation of the second retardation layer, and signs thereof are opposite to each other, and
the thickness direction retardation of the first compensation layer is greater than or equal to one-half of the thickness direction retardation of the second retardation layer, and is less than or equal to three times of the thickness direction retardation of the second retardation layer, and signs thereof are opposite to each other.

20. The polarization unit of claim 17, wherein
the first retardation layer has an in-plane retardation value for 550 nm wavelength incident light in a range of about 220 nm to about 270 nm, a short-wavelength dispersion value in a range of about 1.04 to about 1.11, and a long-wavelength dispersion value in a range of about 0.90 to about 1.02, and
the second retardation layer has an in-plane retardation value for 550 nm wavelength incident light in a range of about 110 nm to about 150 nm, a short-wavelength dispersion value in a range of about 1.04 to about 1.11, and a long-wavelength dispersion value in a range of about 0.90 to about 1.02.

* * * * *